United States Patent
Yun et al.

(10) Patent No.: US 9,679,620 B1
(45) Date of Patent: Jun. 13, 2017

(54) MEMORY DEVICE WITH SENSE AMPLIFIER GROUPS AND PIPE LATCH GROUPS

(71) Applicant: SK hynix Inc., Gyeonggi-do (KR)

(72) Inventors: Tae-Sik Yun, Gyeonggi-do (KR); Dong-Beom Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/213,327

(22) Filed: Jul. 18, 2016

(30) Foreign Application Priority Data

Feb. 15, 2016  (KR) .......................... 10-2016-0017038

(51) Int. Cl.
G11C 7/00 (2006.01)
G11C 7/06 (2006.01)
G11C 7/10 (2006.01)
G11C 7/12 (2006.01)

(52) U.S. Cl.
CPC ................ G11C 7/065 (2013.01); G11C 7/10 (2013.01); G11C 7/12 (2013.01)

(58) Field of Classification Search
CPC ....... G11C 11/4091; G11C 7/12; G11C 7/065; G11C 7/1051; G11C 7/10; G11C 7/1087; G11C 7/1078
USPC ........................ 365/180.05, 205, 207, 230.03
See application file for complete search history.

(56) References Cited

U.S. PATENT DOCUMENTS 6,288,947 B1 * 9/2001 Kim ..................... G11C 7/1006
365/189.05

FOREIGN PATENT DOCUMENTS

KR    1020010027117    4/2001
KR      100486221      9/2005

* cited by examiner

Primary Examiner — David Lam
(74) Attorney, Agent, or Firm — IP & T Group LLP

(57) ABSTRACT

A memory device may include a plurality of first sense amplifiers including a plurality of corresponding first input terminals, a plurality of second sense amplifiers including a plurality of corresponding second input terminals, the plurality of first and second sense amplifiers being suitable for amplifying data received through the respective plurality of first and second input terminals, and for outputting the amplified data which include first and second data outputted by the plurality of first sense amplifiers and third and fourth data outputted by the plurality of second sense amplifiers; a plurality of first pipe latches suitable for latching and outputting the first and second data at a specific interval; a plurality of second pipe latches suitable for latching and outputting the third and fourth data at a specific interval; and an input/output line coupled to the plurality of first and second pipe latches, suitable for outputting the first, second, third and fourth data.

19 Claims, 10 Drawing Sheets

MEMORY DEVICE WITH SENSE AMPLIFIER GROUPS AND PIPE LATCH GROUPS

CROSS-REFERENCE TO RELATED APPLICATION(S)

The present application claims priority under 35 U.S.C 119(a) to Korean Patent Application No. 10-2016-0017038, filed on Feb. 15, 2016, which is incorporated herein by reference in its entirety.

BACKGROUND

1. Field

Exemplary embodiments of the present invention relate to a memory device.

2. Description of the Related Art

FIG. 1 is a diagram illustrating part of a conventional memory device 100.

Referring to FIG. 1, the memory device may include first and second banks 110 and 120, first and second sense amplifier groups 130 and 140, first and second local buses LIO1<0:7>/LIO1B<0:7> and LIO02<0:7>/LIO2B<0:7>, and first and second input/output buses IO1<0:7> and IO2<0:7>.

In the memory device 100 of FIG. 1, each of the first and second banks 110 and 120 may include a plurality of memory cells (not shown in FIG. 1) for storing data.

The first and the second local buses LIO1<0:7>/LIO1B<0:7> and LIO2<0:7>/LIO2B<0:7> may transfer data, output by the first and the second banks 110 and 120, to the first and the second sense amplifier groups 130 and 140, respectively. For reference, the data output by the first and second banks 110 and 120 includes data in which data of 1 bit includes primary data and secondary data using differential signaling (hereinafter called differential data). Accordingly, the first and second local buses LIO1<0:7>/LIO1B<0:7> and LIO2<0:7>/LIO2B<0:7> may include the plurality of primary local lines LIO1<0:7> and IO2<0:7> for transferring the primary data and the plurality of secondary local lines LIO1B<0:7> and LIO2B<0:7> for transferring the secondary data.

Each of the first and second sense amplifier groups 130 and 140 may include a plurality of input/output sense amplifiers (not shown in FIG. 1) for amplifying the data of each of the local buses LIO1<0:7>/LIO1B<0:7> and LIO2<0:7>/LIO2B<0:7> and outputting the amplified data. For reference, the first and second sense amplifier groups 130 and 140 may convert differential data into data using single ended signaling (hereinafter called single data) and output the converted data.

The first and second input/output buses IO1<0:7> and IO2<0:7> may transfer data output by the respective sense amplifier groups 130 and 140.

In a read operation, when the first bank 110 is selected, data output by the first bank 110 may be transferred to the first sense amplifier group 130 through the first local buses LIO1<0:7>/LIO1B<0:7>, may be amplified, and may be transferred through the first input/output buses IO1<0:7>. Furthermore, in a read operation, when the second bank 120 is selected, data output by the second bank 120 may be transferred to the second sense amplifier group 140 through the second local buses LIO2<0:7>/LIO2B<0:7>, may be amplified, and may be transferred through the second input/output buses IO2<0:7>.

In the memory device 100 of FIG. 1, the first and second banks 110 and 120 include independent data output paths. Accordingly, an operation for reading the data of the first and second banks 110 and 120 can be performed without being limited to a CAS (column access strobe) to CAS delay time (tCCD). For example, the data of the second bank 120 may be read while the data of the first bank 110 is read. However, the area of the memory device 100 may be greatly increased because each bank needs to include local buses, a sense amplifier group, and input/output buses.

FIG. 2 is a diagram illustrating part of another conventional memory device 200.

Referring to FIG. 2, the memory device 200 may include first and second banks 210 and 220, first and second switch groups 230 and 240, a sense amplifier group 250, and first and second local buses LIO1<0:7>/LIO1B<0:7> and LIO2<0:7>/LIO2B<0:7>, and input/output buses IO<0:7>.

When the first bank 210 is selected, the first switch group 230 couples the first local buses LIO1<0:7>/LIO1B<0:7> and the sense amplifier group 250. When the second bank 220 is selected, the second switch group 240 couples the second local buses LIO2<0:7>/LIO2B<0:7> and the sense amplifier group 250. Each of the first and second switch groups 230 and 240 may include a plurality of switches (not shown in FIG. 2) coupled between the local lines and sense amplifiers.

The sense amplifier group 250 may include a plurality of input/output sense amplifiers (not shown in FIG. 2) for amplifying the data of local buses corresponding to a selected bank and outputting the amplified data. The input/output buses IO<0:7> may transfer data outputted by the sense amplifier group 250.

In a read operation, when the first bank 210 is selected, the first switch group 230 couples the first local buses LIO1<0:7>/LIO1B<0:7> and the sense amplifier group 250. Data output by the first bank 210 may be transferred to the sense amplifier group 250 through the first local buses LIO1<0:7>/LIO1B<0:7>, may be amplified, and may be transferred through the input/output buses IO<0:7>.

Furthermore, in a read operation, when the second bank 220 is selected, the second switch group 240 couples the second local buses LIO2<0:7>/LIO2B<0:7> and the sense amplifier group 250. Accordingly, data output by the second bank 220 may be transferred to the sense amplifier group 250 through the second local buses LIO2<0:7>/LIO2B<0:7>, may be amplified, and may be transferred through the input/output buses IO<0:7>.

The area of the memory device 200 can be reduced because the first and second banks 210 and 220 share the data output path. However, the data of the first and second banks 210 and 220 cannot be read at the same time, and there is a specific temporal restriction when data is continuously read. That is, when one of the first and second banks 210 and 220 is read, the data of the other of the first and second banks 210 and 220 cannot not be read within a specific time after the data of the one of the first and second banks 210 and 220 is read.

Typically, switches included in the first and second switch groups 230 and 240 are pass gates which generally have a high turn-on resistance. Accordingly, a high-speed operation of a memory device may be disadvantageous due to a delay generated when the data of local buses passes through the pass gate.

SUMMARY

Various embodiments are directed to the provision of a memory device having a reduced area, wherein sense amplifiers and input/output lines are shared between different banks using a pipe latch without a switch.

In an embodiment, a memory device may include a plurality of first sense amplifiers including a plurality of corresponding first input terminals, a plurality of second sense amplifiers including a plurality of corresponding second input terminals, the plurality of first and second sense amplifiers being suitable for amplifying data received through the respective plurality of first and second input terminals, and for outputting the amplified data which include first and second data outputted by the plurality of first sense amplifiers and third and fourth data outputted by the plurality of second sense amplifiers; a plurality of first pipe latches suitable for latching and outputting the first and second data at a specific interval; a plurality of second pipe latches suitable for latching and outputting the third and fourth data at a specific interval; and an input/output line coupled to the plurality of first and second pipe latches, suitable for outputting the first, second, third and fourth data.

In an embodiment, a memory device may include a plurality of bank groups, each including first and second banks; a plurality of sense amplifier groups, each being shared by the first and second banks of each of the plurality of bank groups, suitable for amplifying and outputting data output by a selected bank from among the first and second banks; a plurality of pipe latch groups, each suitable for latching data output by each of the plurality of sense amplifier groups at a specific interval, delaying some of the latched data, and continuously outputting the latched and delayed data; and an input/output bus being shared by the plurality of pipe latch groups.

DETAILED DESCRIPTION

Figure 1:
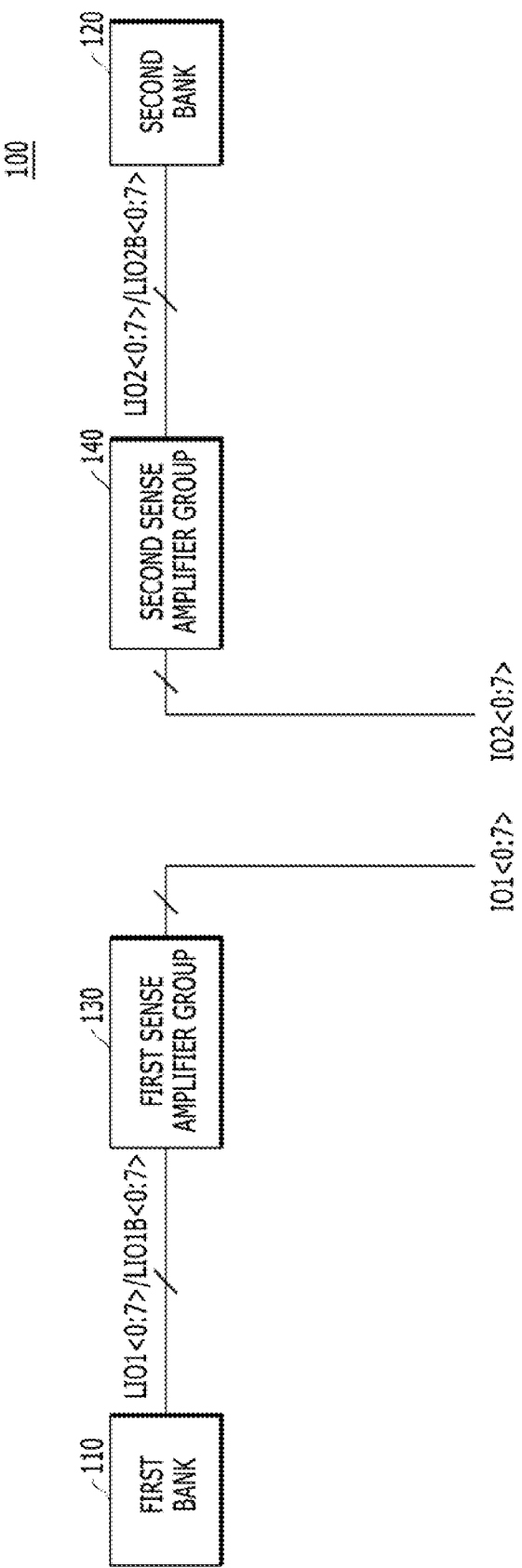
FIG. 1 is a diagram illustrating part of a conventional memory device.

Various embodiments will be described below in more detail with reference to the accompanying drawings. The present invention may, however, be embodied in different forms and should not be construed as being limited to the embodiments set forth herein. Rather, these embodiments are provided so that this disclosure will be thorough and complete, and will fully convey the present invention to those skilled in the art. Throughout the disclosure, like reference numerals refer to like parts throughout the various figures and embodiments of the present invention.

Figure 3:
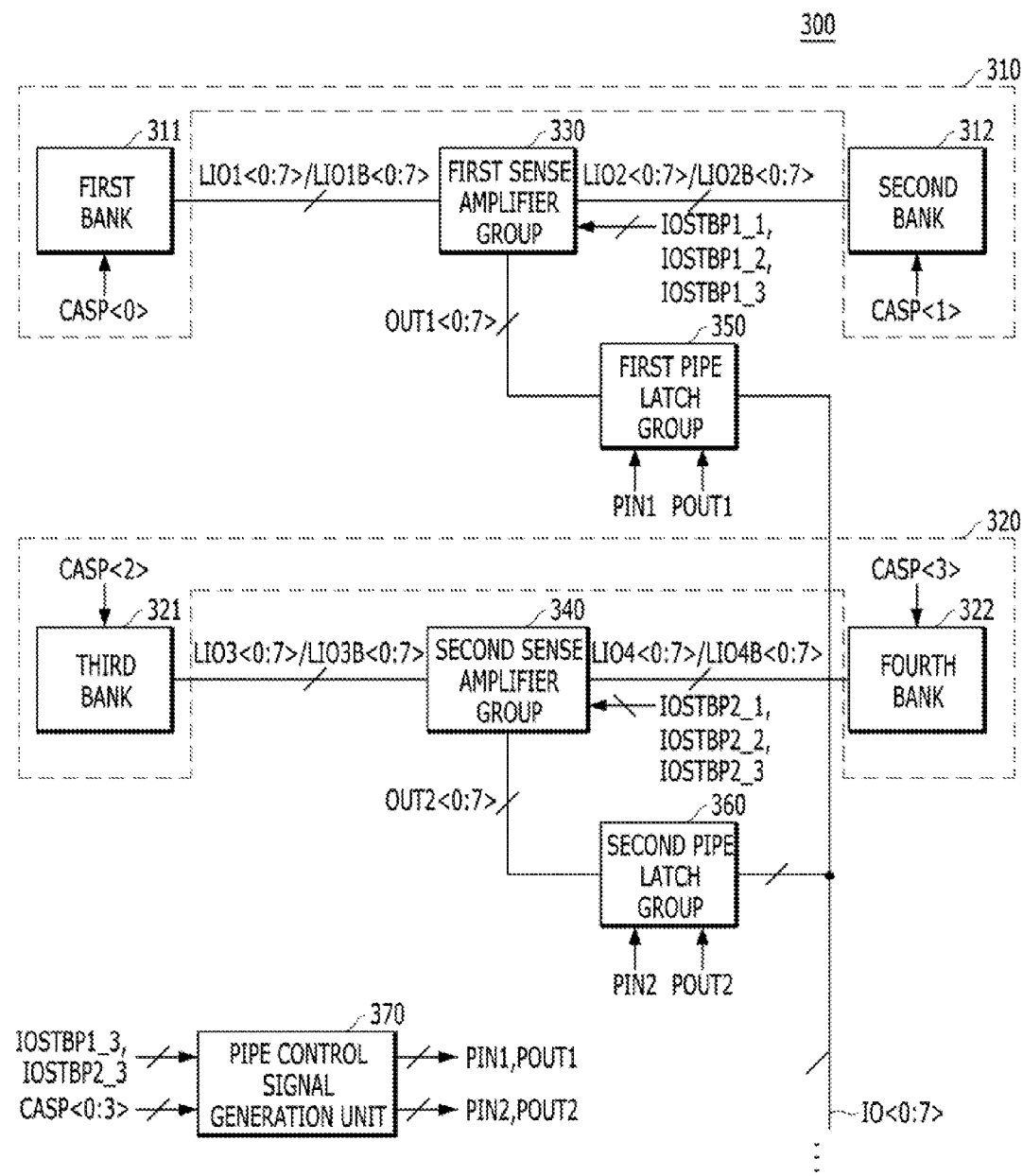
FIG. 3 is a diagram illustrating a memory device, according to an embodiment of the present invention.

Referring now to FIG. 3, a memory device 300 is provided, according to an embodiment of the present invention.

According to the embodiment of FIG. 3, the memory device may include first and second bank groups 310 and 320, first and second sense amplifier groups 330 and 340, first and second pipe latch groups 350 and 360, a pipe control signal generation unit 370, and input/output buses OI<0:7>.

The first bank group 310 may include first and second banks 311 and 312, and the second bank group 320 may include third and fourth banks 321 and 322. Each of the first to the fourth banks 311, 312, 321, and 322 may include a plurality of memory cells (not shown in FIG. 3) capable of storing data. Each of the first to the fourth banks 311, 312, 321, and 322 outputs data when each of first to fourth column signals CASP<0:3> is enabled. In a read operation, when each of the first to the fourth banks 311, 312, 321, and 322 is selected, each of the first to the fourth column signals CASP<0:3> may be enabled twice at a specific interval (e.g., two clocks). That is, when a read operation is performed, a selected bank may output data twice.

Data output by the first bank 311 is inputted to the input terminal groups (e.g., IN1_1<0:7>/IN1_1B<0:7> in FIG. 4) of the first sense amplifier group 330 through first local buses LIO1<0:7>/LIO1B<0:7>. Data output by the second bank 312 is inputted to the Input terminal groups (e.g., IN1_2<0:7>/IN1_2B<0:7> in FIG. 4) of the first sense amplifier group 330 through second local buses LIO2<0:7>/LIO2B<0:7>. Data output by the third bank 321 is inputted to the Input terminal groups (e.g., IN2_1<0:7>/IN2_1B<0:7> in FIG. 4) of the second sense amplifier group 340 through third local buses LIO3<0:7>/LIO3B<0:7>. Data output by the fourth bank 322 is inputted to the input terminal groups (e.g., IN2_2<0:7>/IN2_2B<0:7> in FIG. 4) of the second sense amplifier group 340 through the fourth local buses LIO4<0:7>/LIO4B<0:7>.

The first sense amplifier group 330 amplifies the data output of the first and/or of the second banks 311, 312 of the first bank group 310. The first sense amplifier group 330 then outputs the amplified data to the first pipe latch group 350. For example, when a strobe pulse IOSTBP1_1 is enabled, the first sense amplifier group 330 amplifies data inputted to the input terminal groups IN1_1<0:7>/IN1_1B<0:7> and output the amplified data. When a strobe pulse IOSTBP1_2 is enabled, the first sense amplifier group 330 amplifies data inputted to the input terminal groups IN1_2<0:7>/IN1_2B<0:7> and then outputs the amplified data.

The second sense amplifier group 340 amplifies the data output of the third and/or the fourth banks 321 and 322 of the second bank group 320. The second sense amplifier group 340 then outputs the amplified data to the second pipe latch group 360. When a strobe pulse IOSTBP2_1 is enabled, the second sense amplifier group 340 amplifies data inputted to the input terminal groups IN2_1<0:7>/IN2_1B<0:7> and outputs the amplified data. When a strobe pulse IOSTBP2_2 is enabled, the second sense amplifier group 340 amplifies data inputted to the input terminal groups IN2_2<0:7>/IN2_2B<0:7> and outputs the amplified data.

Each of the first and the second sense amplifier groups 330 and 340 amplifies input data twice and outputs the amplified data. When each of the strobe pulses IOSTBP1_1, IOSTBP1_2 or IOSTBP2_1, IOSTBP2_2 is enabled, each of the first and the second sense amplifier groups 330 and 340 may perform a primary (or first) amplification of input data. When a strobe pulse IOSTBP1_3 or IOSTBP2_3 is enabled, each of the first and the second sense amplifier groups 330 and 340 may perform a secondary (or second) amplification of input data. For reference, the strobe pulse IOSTBP1_3 may be a signal enabled after a specific time lapses from the time that the strobe pulse IOSTBP1_1 or the strobe pulse IOSTBP1_2 is enabled.

The first pipe latch group 350 latches the first and second data outputs by the output stage groups OUT1<0:7> of the first sense amplifier group 330 at a specific interval, delays the first data by a time corresponding to the interval between the first data and the second data, and continuously output the first and the second data to the input/output buses IO<0:7>. The first pipe latch group 350 receives a data output by the first sense amplifier group 330 when a first pipe input signal PIN1 is enabled, latches the data, and outputs the latched data when a first pipe output signal POUT1 is enabled.

The second pipe latch group 360 latches the third data and fourth data output by the output stage group OUT2<0:7> of the second sense amplifier group 340 at a specific interval, delays the third data by a time corresponding to the interval between the third data and the fourth data, and continuously outputs the third and the fourth data to the input/output buses IO<0:7>. The second pipe latch group 360 receives the data output by the second sense amplifier group 340 when a second pipe input signal PIN2 is enabled, latches the received data, and outputs the latched data when a second pipe output signal POUT2 is enabled.

The pipe control signal generation unit 370 generates the first and the second pipe input and outputs signals PIN1, PIN2, POUT1, and POUT2 to control the pipe latch groups 350 and 360. The pipe control signal generation unit 370 enables the pipe input signals PIN1 and PIN2 at a point of time at which data amplified by the first and the second sense amplifier groups 330 and 340 is outputted so that data output by the first and the second sense amplifier groups 330 and 340 can be received and latched by the first and the second pipe latch groups 350 and 360, respectively. The pipe control signal generation unit 370 generates the first pipe input signal PIN1 using the strobe pulse IOSTBP1_3 and generates the second pipe input signal PIN2 using the strobe pulse IOSTBP2_3.

The pipe control signal generation unit 370 enables the pipe output signals POUT1 and POUT2 so that data latched in the pipe latch groups 350 and 360 are outputted at a specific point of time. When a read operation is performed, the pipe control signal generation unit 370 enables the pipe output signals POUT1 and POUT2 after one clock if the column signals CASP<0:3> are enabled first and may immediately enable the pipe output signals POUT1 and POUT2 if the column signals CASP<0:3> are enabled second. The pipe control signal generation unit 370 generates the first pipe output signal POUT1 using the column signals CASP<0:1> and generates the second pipe output signal POUT2 using the column signals CASP<2:3>.

In the memory device of FIG. 3, if the data of a bank included in one (e.g., the first bank group 310) of the first and the second bank groups 310 and 320 is read and the data of a bank included in the other (e.g., the second bank group 320) of the first and the second bank groups 310 and 320 is then read, a CAS to CAS delay time (tCCD) may be a first time (e.g., two clocks). Furthermore, if the data of a bank included in one (e.g., the first bank group 310) of the first and the second bank groups 310 and 320 is read and the data of a bank included in the same bank group (e.g., the first bank group 310) is then read, a tCCD may be a second time (e.g., four clocks) longer than the first time. In this case, the first time is called a short tCCD, and the second time is called a long tCCD.

In the memory device of FIG. 3, a pipe latch can solve a problem in that data output by different banks collide against each other if different banks are continuously read by latching a first data output by a bank when a read operation is performed and outputting the latched data after one clock, that is, a time corresponding to an interval between the first output data and second output data. Accordingly, different bank groups can share input/output buses.

Figure 4:
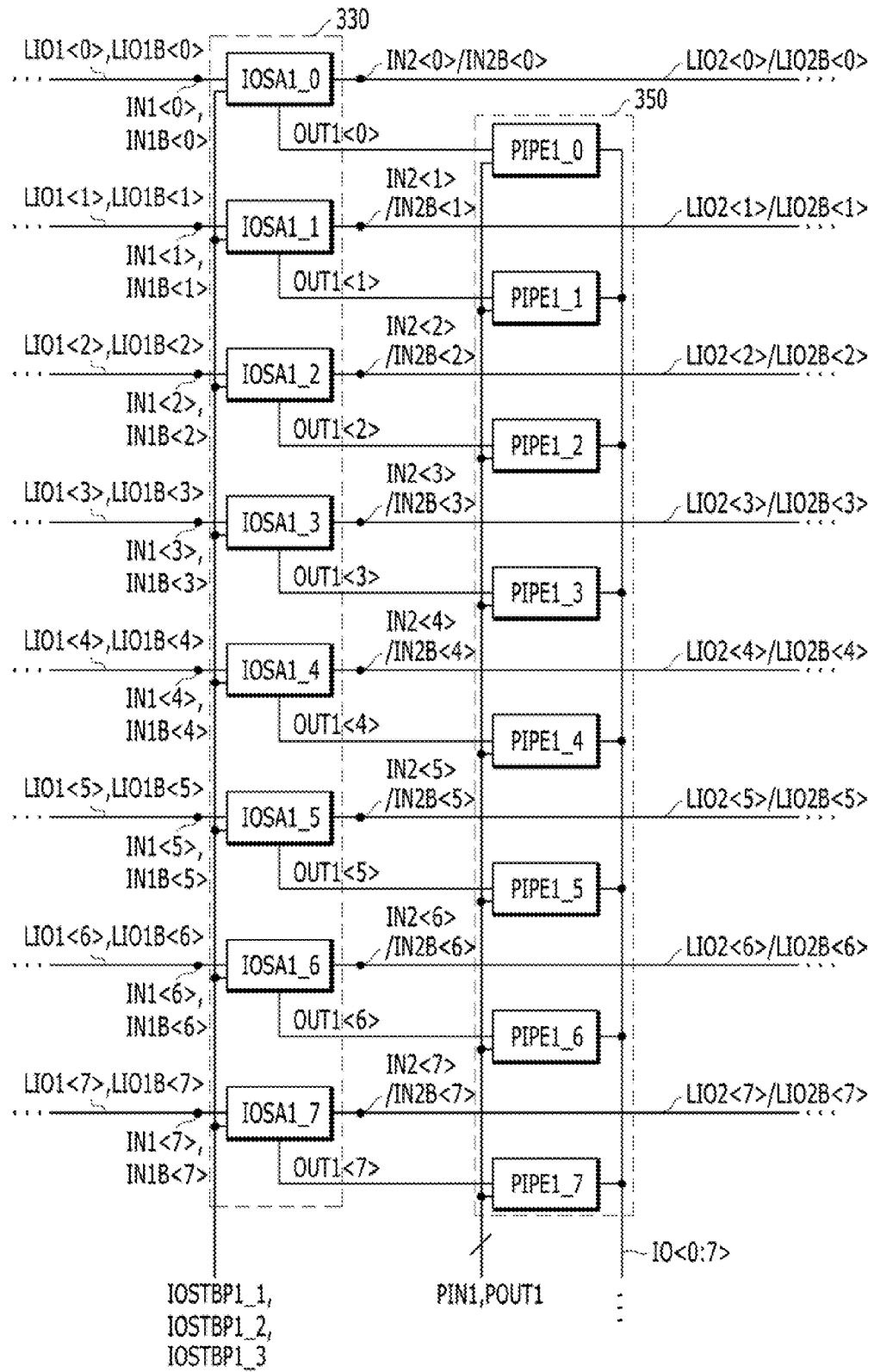
FIG. 4 is a diagram illustrating examples of a first sense amplifier group and a first pipe latch group employed in the memory device of FIG. 3.

FIG. 4 is a detailed diagram illustrating the first sense amplifier group 330 and the first pipe latch group 350.

Referring to FIG. 4, the first sense amplifier group 330 may include a plurality of first sense amplifiers IOSA1_0-IOSA1_7. The first pipe latch group 350 may include a plurality of first pipe latches PIPE1_0-PIPE1_7.

The first and the second local buses LIO1<0:7>/LIO1B<0:7> and LIO2<0:7>/LIO2B<0:7> include a plurality of first and second primary local lines LIO1<0:7> and LIO2<0:7> and a plurality of first and second secondary local lines LIO1B<0:7> and LIO2B<0:7>, respectively. The input/output buses IO<0:7> include a plurality of input/output lines IO<0:7>.

In the plurality of first sense amplifiers IOSA1_0-IOSA1_7, the plurality of first primary/secondary local lines LIO1<0:7>/LIO1B<0:7> are coupled to first primary/secondary input terminals IN1<0:7>/IN1B<0:7>, respectively, and the plurality of second primary/secondary local lines LIO2<0:7>/LIO2B<0:7> are coupled to second primary/secondary input terminals IN2<0:7>/IN2B<0:7>, respectively.

When the strobe pulse IOSTBP1_1 is enabled, the plurality of first sense amplifiers IOSA1_0-IOSA1_7 may amplify the data of the first primary/secondary input terminals IN1<0:7>/IN1B<0:7> and output the data to corresponding ones of the output stage groups OUT1<0:7>. When the strobe pulse IOSTBP1_2 is enabled, the plurality of first sense amplifiers IOSA1_0-IOSA1_7 may amplify the data of the second primary/secondary input terminals IN2<0:7>/IN2B<0:7> and output the amplified data to corresponding to ones of the output stage groups OUT1<0:7>.

When the strobe pulse IOSTBP1_3 is enabled, the plurality of first sense amplifiers IOSA1_0-IOSA1_7 may amplify the first amplified data for a second time and output the amplified data.

When the first pipe input signal PIN1 is enabled, each of the plurality of first pipe latches PIPE1_0-PIPE1_7 receives data output by each of the plurality of first sense amplifiers IOSA1_0-IOSA1_7 and latches the received data. Furthermore, when the first pipe output signal POUT1 is enabled, each of the plurality of first pipe latches PIPE1_0-PIPE1_7 outputs the latched data to each of the plurality of input/output lines IO<0:7>.

The detailed configuration of each of the second sense amplifier group 340 and the second pipe latch group 360 is almost similar to that of FIG. 4.

Figure 5:
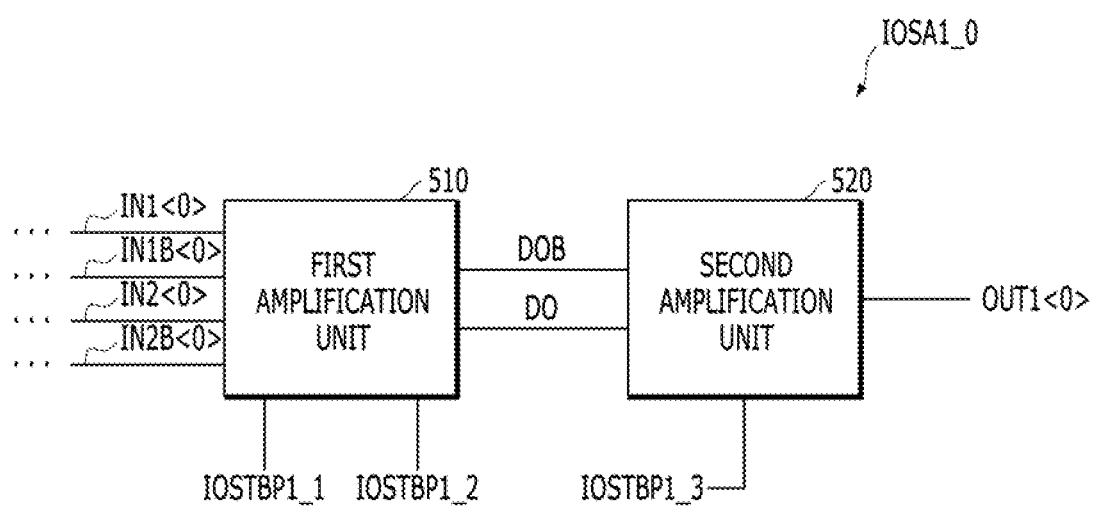
FIG. 5 is a diagram illustrating a configuration of a sense amplifier of the memory device of FIG. 3, according to an embodiment of the present invention.

FIG. 5 is a diagram illustrating a configuration of the sense amplifier IOSA1_0 of the first sense amplifier group 330 in FIG. 4.

Referring to FIG. 5, the sense amplifier IOSA1_0 may include a first amplification unit 510 and a second amplification unit 520.

When the strobe pulse IOSTBP1_1 is enabled, the first amplification unit 510 amplifies the data of the first primary/secondary input terminals IN1<0> and IN1B<0> and outputs the amplified data DO/DOB. When the strobe pulse IOSTBP1_2 is enabled, the first amplification unit 510 amplifies the data of the second primary/secondary input terminals IN2<0> and IN2B<0> and outputs the amplified data DO/DOB. For reference, the strobe pulse IOSTBP1_1 may be a signal enabled after a specific time when the first column signal CASP<0> is enabled, and the strobe pulse IOSTBP1_2 may be a signal enabled after a specific time lapses from the time that the second column signal CASP<1> is enabled.

When the strobe pulse IOSTBP1_3 is enabled, the second amplification unit 520 amplifies the data DO/DOB output by the first amplification unit 510 and outputs the amplified data. For reference, the strobe pulse IOSTBP1_3 may be a signal enabled after a specific time lapses from the time that when the strobe pulse IOSTBP1_1 or the strobe pulse IOSTBP1_2 is enabled.

Detailed configurations of the first and the second amplification units 510 and 520 are described below with reference to FIGS. 6 and 7.

Figure 6:
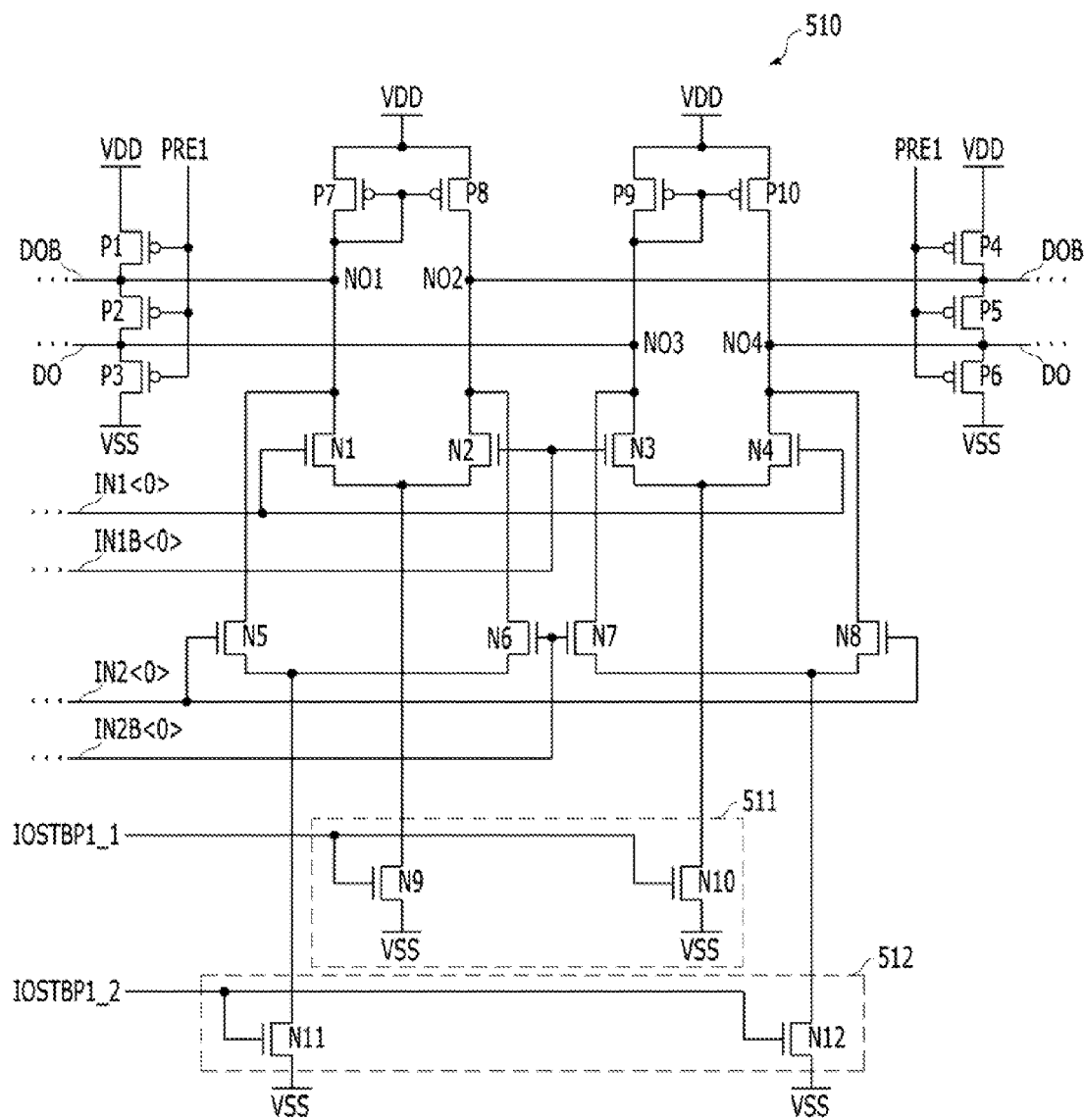
FIG. 6 is a diagram illustrating a configuration of a first amplification unit of the sense amplifier of FIG. 5, according to an embodiment of the present invention.

FIG. 6 is a diagram illustrating a configuration of the first amplification unit 510 in FIG. 5.

According to the embodiment of FIG. 6, the first amplification unit 510 may include a first input terminal control unit 511, a second input terminal control unit 512, and a plurality of transistors N1-N8 and P1-P10.

The first input terminal control unit 511 may enable the first primary/secondary input terminals IN1<0>/IN1B<0> when the strobe pulse IOSTBP1_1 is enabled and may disable the first primary/secondary input terminals IN1<0>/IN1B<0> when the strobe pulse IOSTBP1_1 is disabled. The second input terminal control unit 512 may enable the second primary/secondary input terminals IN2<0>/IN2B<0> when the strobe pulse IOSTBP1_2 is enabled and may disable the second primary/secondary input terminals IN2<0>/IN2B<0> when the strobe pulse IOSTBP1_2 is disabled. The first amplification unit 510 amplifies the data of an activated one of the first and the second primary/secondary input terminals IN1<0>/IN1B<0> and IN2<O>/IN2B<0> and outputs the amplified data. Furthermore, the data of a deactivated primary/secondary input terminal are blocked.

The transistors N1-N8 and P7-P10 form an amplification circuit for amplifying the data of an activated input terminal and outputting the amplified data DO/DOB. The transistors P1-P6 form a precharge circuit for precharging nodes NO1-NO4, coupled to the transistors P1-P6, with a power supply voltage VDD when both the strobe pulses IOSTBP1_1 and IOSTBP1_2 are disabled, that is, when data is not received. A first precharge signal PRE1 may be a signal enabled to a low level when both the strobe pulses IOSTBP1_1 and IOSTBP1_2 are disabled.

Figure 2:
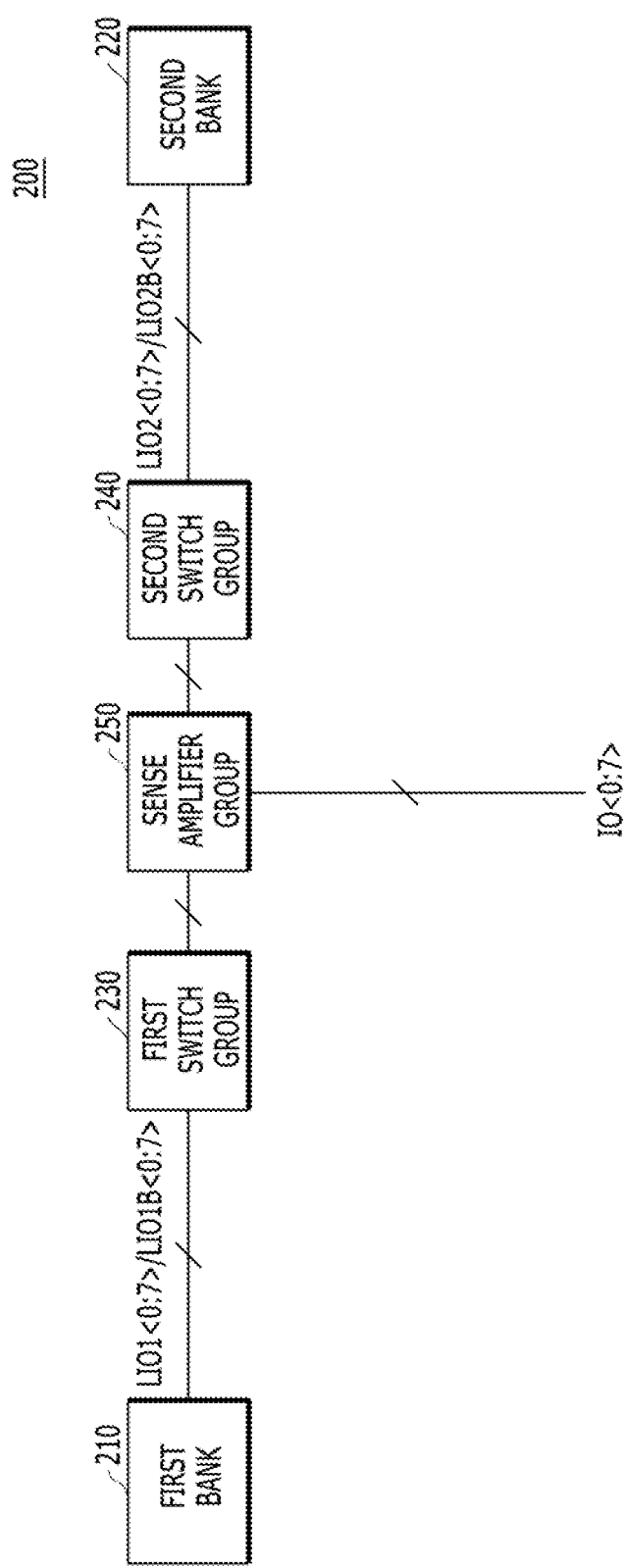
FIG. 2 is a diagram illustrating part of another conventional a memory device.

The first amplification unit 510 selectively activates the first and the second primary/secondary input terminals IN1<0>/IN1B<0> and IN2<0>/IN2B<0> using the four transistors N9-N12 so that the first and the second banks 311 and 312 can share a sense amplifier. That is, a pass gate is not used as in the memory device of FIG. 2, and two banks can share a sense amplifier. That is, in the memory device of FIG. 3, data inputted to the first and the second primary/secondary input terminals IN1<0>/IN1B<0> and IN2<0>/IN2B<0> are not delayed by the configuration of the first amplification unit 510 of FIG. 6.

Figure 7:
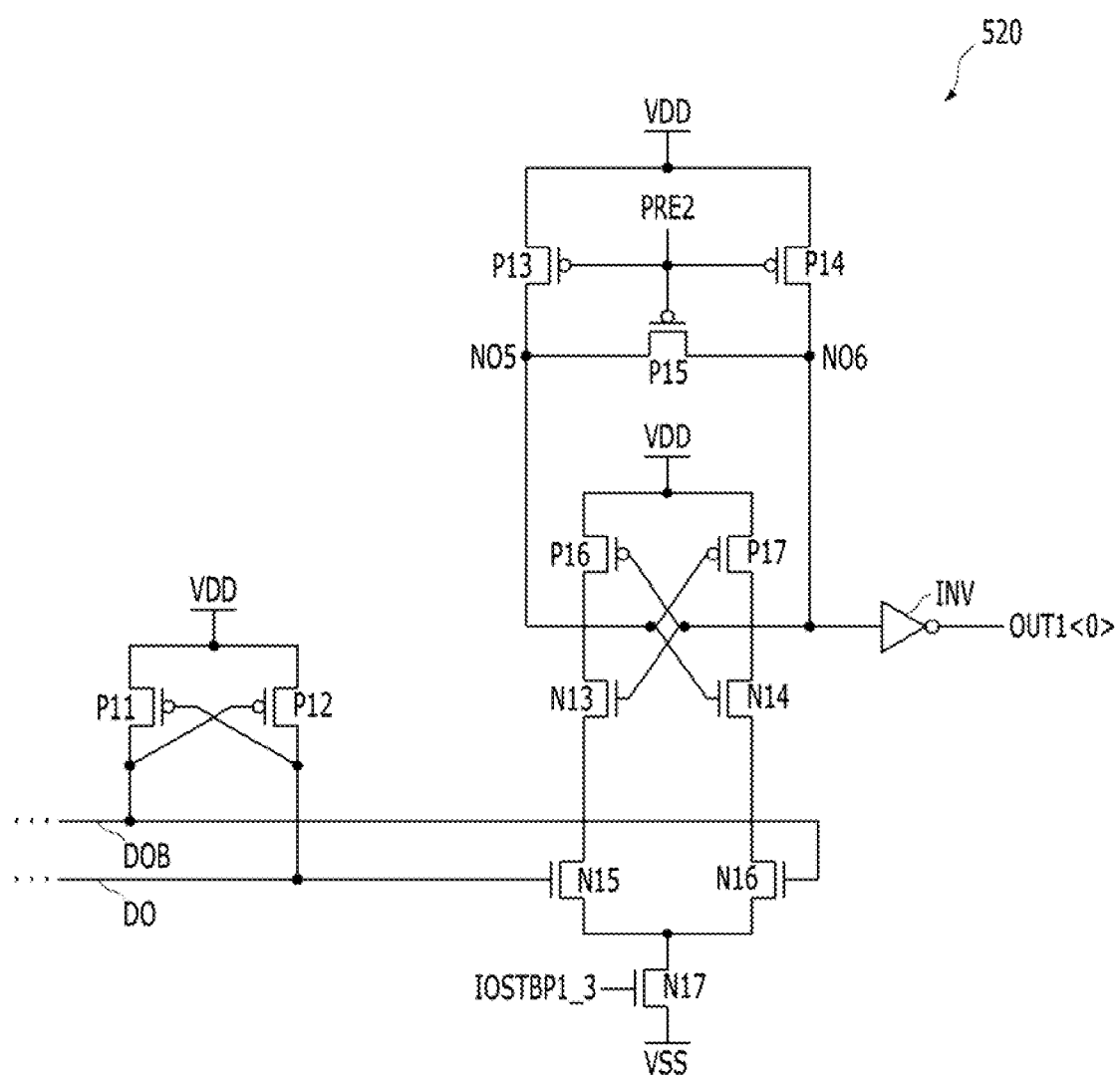
FIG. 7 is a diagram illustrating a configuration of a second amplification unit 520 of the sense amplifier of FIG. 5, according to an embodiment of the present invention.

FIG. 7 is a diagram illustrating the configuration of the second amplification unit 520 in FIG. 5.

According to the embodiment of FIG. 7, the second amplification unit 520 may include a plurality of transistors P11-P17 and N13-N16 and an inverter INV.

The transistors P11, P12, P16, P17, and N13-N17 form an amplification circuit for amplifying data output by the first amplification unit 510. When the strobe pulse IOSTBP1_3 is enabled, the transistor N17 activates the amplification circuit formed of the transistors P11, P12, P16, P17, and N13-N16. The transistors P13-P15 form a precharge circuit for precharging nodes N05-N06, coupled to the transistors P13-P15, with the power supply voltage VDD when data is not received. A second precharge signal PRE2 may be a signal enabled to a low level after data is amplified by the enabling of the strobe pulse IOSTBP1_3.

For reference, in FIGS. 3 and 4, the remaining sense amplifiers (i.e., IOSA1_1-IOSA1_7 and the sense amplifiers included in the second sense amplifier group 340) have the same configurations and operations as the sense amplifier IOSA1_0 described with reference to FIGS. 5 to 7.

Figure 8:
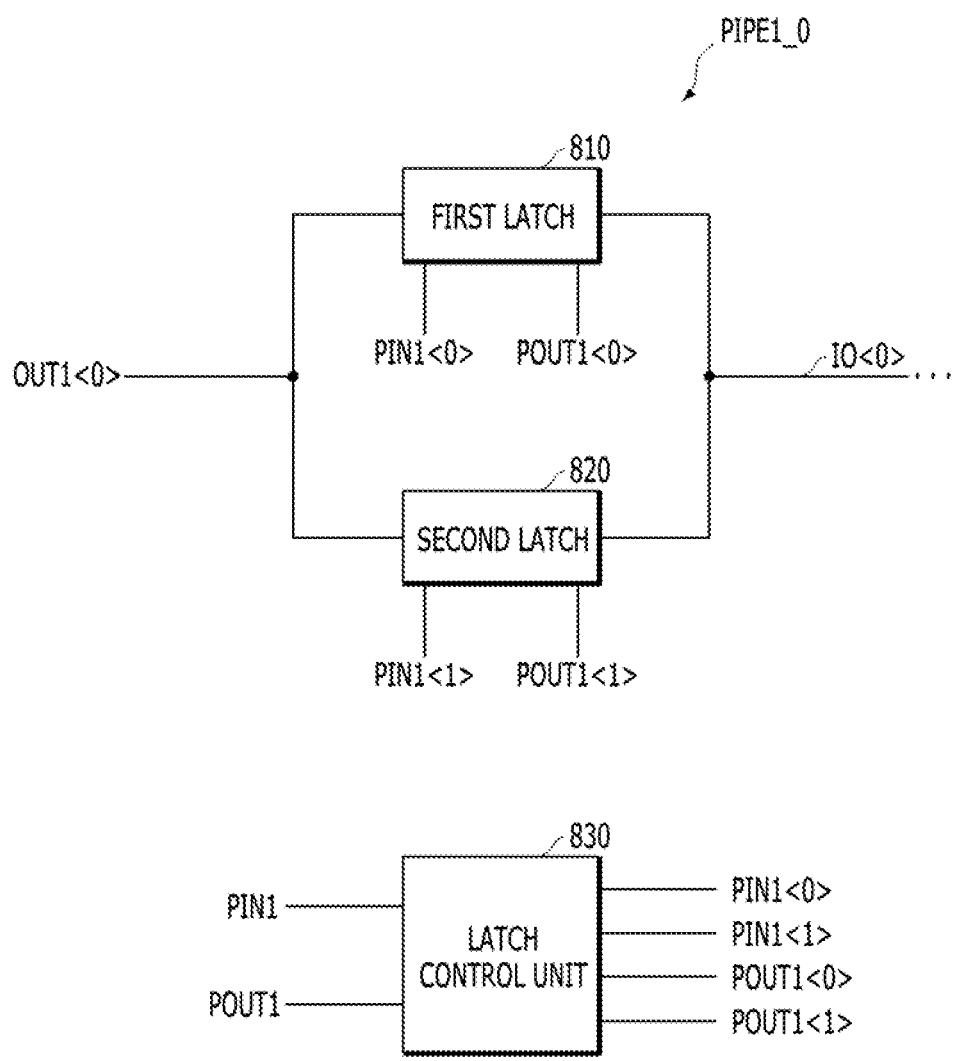
FIG. 8 is a diagram illustrating the configuration of a pipe latch, according to an embodiment of the present invention.

FIG. 8 is a diagram illustrating a configuration of a pipe latch PIPE1_0 in FIG. 4.

According to the embodiment of FIG. 8, the pipe latch PIPE1_0 may include a first latch 810, a second latch 820, and a latch control unit 830.

The first latch 810 latches data OUT1<0> when a first input signal PIN1<0> is enabled and outputs the latched data to the input/output line IO<0> when a first output signal POUT1<0> is enabled.

The second latch 820 latches input data OUT1<0> when a second input signal PIN1<1> is enabled and outputs the latched data to the Input/output line IO<0> when a second output signal POUT1<1> is enabled.

The latch control unit 830 generates the first and the second input signals PIN1<0:1> in response to the first pipe input signal PIN1. The latch control unit 830 generates the first and the second output signal POUT1<0:1> in response to the first pipe output signal POUT1.

The latch control unit 830 enables the first input signal PIN1<0> when the first pipe input signal PIN1 is enabled first and enables the second input signal PIN1<1> when the first pipe input signal PIN1 is enabled second. To this end, the latch control unit 830 may use a counter reset after the first and the second are counted.

Furthermore, the latch control unit 830 enables the first output signal POUT1<0> when the first pipe output signal POUT1 is enabled first and enables the second output signal POUT1<1> when the first pipe output signal POUT1 is enabled second. In this case, when the first output signal POUT1<0> is enabled, the latch control unit 830 may enable the first output signal POUT1<0> after a lapse of one clock (i.e., a time corresponding to a specific interval) from a point of time at which the first pipe output signal POUT1 is enabled first.

For reference, in FIGS. 3 and 4, the remaining pipe latches (i.e., PIPE1_1-PIPE_7 and the pipe latches included in the second pipe latch group 360) have the same configurations and operations as the pipe latch PIPE1_0 described with reference to FIG. 8.

Figure 9:
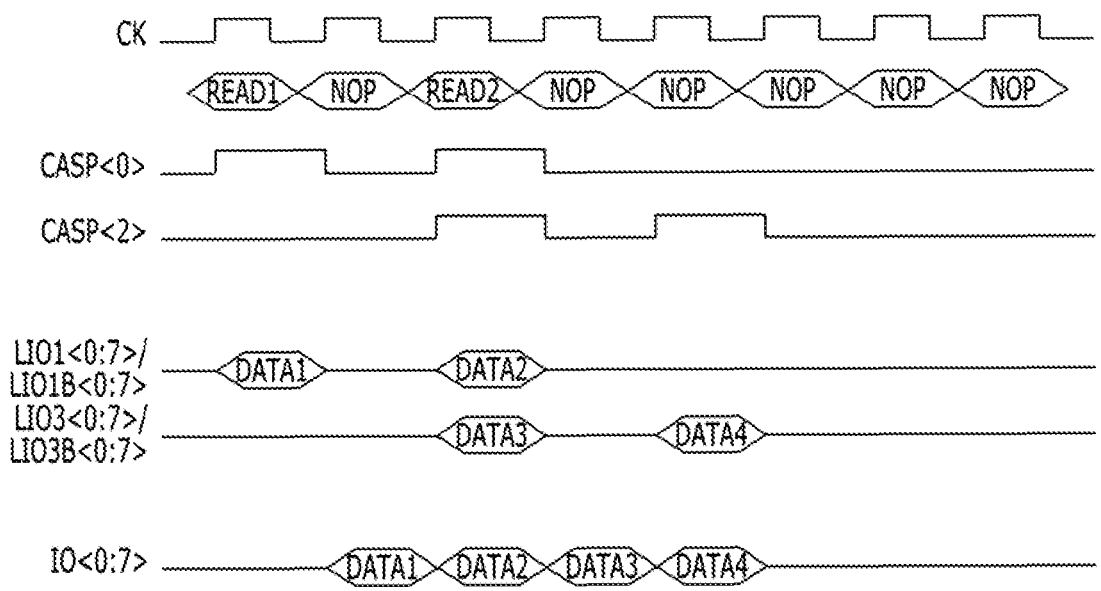
FIG. 9 is a diagram illustrating the operation of the memory device of FIG. 3, according to an embodiment of the present invention.

FIG. 9 is a diagram illustrating an operation of the memory device of FIG. 3.

An operation when a read command READ1 for the first bank 311 and a read command READ2 for the third bank 321 are inputted to the memory device of FIG. 3 at a two-clock interval (a short tCCD, and a clock signal CK is a basis) is described below with reference to FIG. 9.

First, when the read command READ1 is received, the first column signal CASP<0> is enabled twice at a two-clock interval. Furthermore, when the read command READ2 is received, the third column signal CASP<2> is enabled twice at a two-clock interval.

When the first column signal CASP<0> is enabled first, first data DATA1 is output to the first local buses LIO1<0:7>/LIO1B<0:7>. When the first column signal CASP<0> is enabled second, second data DATA2 is output to the first local buses LIO1<0:7>/LIO1B<0:7>.

The data of the first local buses LIO1<0:7>/LIO1B<0:7> is amplified by the first sense amplifier group 330, latched by the first pipe latch group 350, and output to the input/output buses IO<0:7>. At this time, the first data DATA1 and the second data DATA2 are continuously outputted to the input/output buses IO<0:7> because the first data DATA1 is outputted after being latched, after one clock.

Furthermore, when the third column signal CASP<2> is enabled first, third data DATA3 is outputted to the third local buses LIO3<0:7>/LIO3B<0:7>. When the third column signal CASP<2> is enabled second, fourth data DATA4 is outputted to the third local buses LIO3<0:7>/LIO3B<0:7>.

The data of the third local buses LIO3<0:7>/LIO3B<0:7> is amplified by the second sense amplifier group 340, latched by the second pipe latch group 360, and outputted to the input/output buses IO<0:7>. At this time, the third data DATA3 and the fourth data DATA4 are continuously outputted to the input/output buses IO<0:7> because the third data DATA3 is outputted after one clock after being latched.

The second data DATA2 and the third data DATA3 collide against each other if they are outputted to the input/output buses IO<0:7> without a timing adjustment because they are outputted by the different banks at the same time. But it may be seen from FIG. 9 that the second data DATA2 and the third data DATA3 are outputted to the input/output buses IO<0:7> without a collision with the help of the operation of the pipe latch group. For reference, NOP means that no command has been received.

Figure 10:
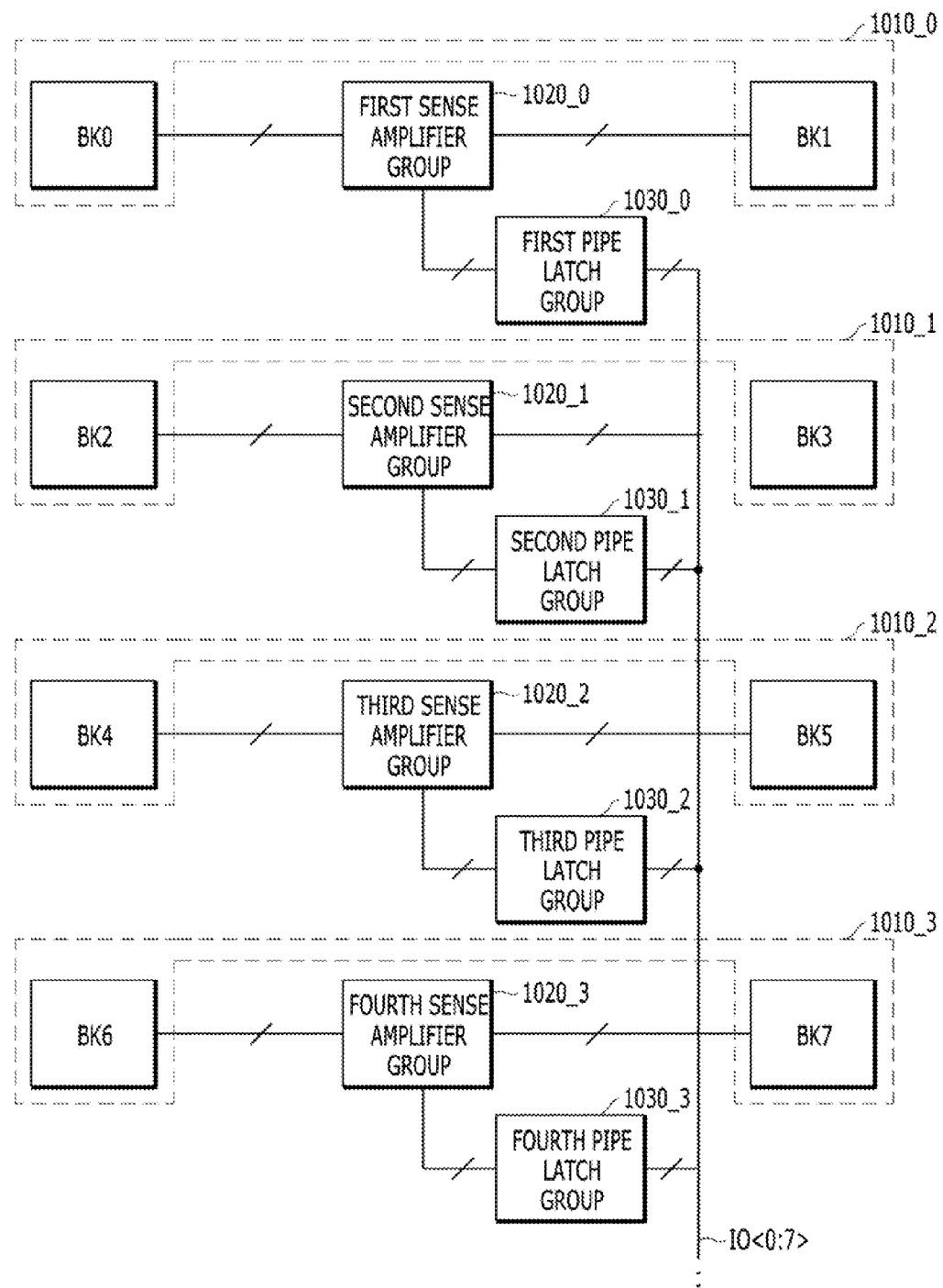
FIG. 10 is a diagram illustrating the configuration of a memory device, according to an embodiment of the present invention an embodiment of the present invention.

FIG. 10 is a diagram illustrating a configuration of a memory device, according to an embodiment of the present invention.

According to the embodiment of FIG. 10, the memory device may include a plurality of bank groups 1010_0-1010_3, a plurality of sense amplifier groups 1020_0-1020_3, a plurality of pipe latch groups 1030_0-1030_3, and input/output buses IO<0:7>.

The plurality of bank groups 1010_0-1010_3 may include left banks BK0, BK2, BK4, and BK6 and right banks BK1, BK3, BK5, and BK7, respectively.

Each of the plurality of sense amplifier groups 1020_0-1020_3 amplifies the data output of a bank included in each of the plurality of bank groups 1010_0-1010_3 and outputs the amplified data. Each of the plurality of sense amplifier groups 1020_0-1020_3 may be shared by the two banks of a corresponding bank group.

Each of the plurality of pipe latch groups 1030_0-1030_3 latches data outputted by each of the plurality of sense amplifier groups 1020_0-1020_3 at a specific interval, delays some of the latched data, and continuously outputs the delayed data.

The input/output buses IO<0:7> are shared by the plurality of pipe latch groups 1030_0-1030_3 and transfer data outputted by the plurality of pipe latch groups 1030_0-1030_3.

FIG. 10 is a diagram illustrating a form in which the plurality of sense amplifier groups 1020_0-1020_3 and the plurality of Input/output buses IO<0:7> are shared if the memory device of FIG. includes larger bank groups than the memory device of FIG. 3. Detailed control signals are not shown in FIG. 10. A detailed configuration and operation of the memory device of FIG. 10 is similar to that shown in and described with reference to FIGS. 3 to 9.

An example in which data output by each bank is 8 bits has been described with reference to FIGS. 3 to 10, but the number of bits of data output by each bank may be changed depending on the design. Furthermore, the number of bank groups included in the memory device, the number of banks included in each bank group, and the number of data output by a selected bank when a read command is applied may be changed depending on the design.

In this technology, data output by a bank is latched using the pipe latch, aligned, and output. Accordingly, the area of the memory device can be reduced because different banks can share the sense amplifier and the input/output lines without a switch.

Although various embodiments have been described for illustrative purposes, it will be apparent to those skilled in the art that various changes and modifications may be made without departing from the spirit and scope of the invention as defined in the following claims.

What is claimed is:

1. A memory device, comprising:
a plurality of first sense amplifiers including a plurality of corresponding first input terminals, a plurality of second sense amplifiers including a plurality of corresponding second input terminals, the plurality of first and second sense amplifiers being suitable for amplifying data received through the respective plurality of first and second input terminals, and for outputting the amplified data which include first and second data outputted by the plurality of first sense amplifiers and third and fourth data outputted by the plurality of second sense amplifiers;
a plurality of first pipe latches suitable for latching and outputting the first and second data at a specific interval;
a plurality of second pipe latches suitable for latching and outputting the third and fourth data at a specific interval; and
an input/output line coupled to the plurality of first and second pipe latches, suitable for outputting the first, second, third and fourth data.

2. The memory device of claim 1, further comprising:
a first bank group including first and second banks;
a second bank group including third and fourth banks;
a plurality of first local lines suitable for transferring data between the first bank and the first input terminal of the plurality of first sense amplifiers;
a plurality of second local lines suitable for transferring data between the second bank and the second input terminal of the plurality of first sense amplifiers;
a plurality of third local lines suitable for transferring data between the third bank and the first input terminal of the plurality of second sense amplifiers; and
a plurality of fourth local lines suitable for transferring data between the fourth bank and the second input terminal of the plurality of second sense amplifiers.

3. The memory device of claim 2, wherein:
if data of a bank included in a first one of the first and the second bank groups is read and data of a bank included in a second one of the first and the second bank groups is then read, a CAS to CAS delay time (tCCD) is a first time, and if data of a bank included in a first one of the first and the second bank groups is read and data of a bank included in the first one of the first and the second bank groups is then read, the tCCD is a second time longer than the first time.

4. The memory device of claim 3, wherein:
the first time comprises two clocks, and
the second time comprises four clocks.

5. The memory device of claim 3, wherein:
each of the plurality of first pipe latches latches the first and the second data and outputs the latched first and second data, the first data being outputted after a time corresponding to the specific interval after the first data is latched, and
each of the plurality of second pipe latches latches the third and the fourth data and outputs the latched third and fourth data, the third data being output after a time corresponding to the specific interval after the third data is latched.

6. The memory device of claim 5, wherein:
each of the plurality of first pipe latches comprises a first latch suitable for latching the first data and outputting the latched first data after the time corresponding to the specific interval and a second latch suitable for latching the second data and outputting the latched second data, and
each of the plurality of second pipe latches comprises a third latch suitable for latching the third data and outputting the latched third data after the time corresponding to the specific interval and a fourth latch suitable for latching the fourth data and outputting the latched fourth data.

7. The memory device of claim 1, wherein each of the plurality of first and second sense amplifiers comprises:
a first amplification unit suitable for amplifying and outputting the data of the first input terminal when a first strobe pulse is enabled and amplifying and outputting the data of the second input terminal when a second strobe pulse is enabled; and
a second amplification unit suitable for amplifying and outputting the data output by the first amplification unit when a third strobe pulse is enabled.

8. The memory device of claim 7, wherein the first amplification unit comprises:
a first input terminal control unit suitable for activating the first input terminal when the first strobe pulse is enabled; and
a second input terminal control unit suitable for activating the second input terminal when the second strobe pulse is enabled.

9. The memory device of claim 7, wherein the third strobe pulse is enabled after a specific time since the first strobe pulse or the second strobe pulse is enabled.

10. The memory device of claim 9, wherein when a read command is applied to the memory device, a column signal which belongs to first to fourth column signals and corresponds to a selected bank is enabled more than twice at a specific interval, wherein the first to the fourth column signals correspond to the first to the fourth banks, respectively.

11. The memory device of claim 10, wherein in the read operation, when a corresponding column signal of the first to the fourth column signals is enabled, a corresponding bank of the first to the fourth banks outputs data to corresponding local lines of the plurality of first to fourth local lines.

12. A memory device, comprising:
a plurality of bank groups, each including first and second banks;
a plurality of sense amplifier groups, each being shared by the first and second banks of each of the plurality of bank groups, suitable for amplifying and outputting data output by a selected bank from among the first and second banks;
a plurality of pipe latch groups, each suitable for latching data output by each of the plurality of sense amplifier groups at a specific interval, delaying some of the latched data, and continuously outputting the latched and delayed data; and
an input/output bus being shared by the plurality of pipe latch groups.

13. The memory device of claim 12, further comprising:
a plurality of first local buses being coupled between the first bank of a corresponding bank group of the plurality of bank groups and a corresponding sense amplifier group of the plurality of sense amplifier groups; and
a plurality of second local buses being coupled between the second bank of a corresponding bank group of the plurality of bank groups and a corresponding sense amplifier group of the plurality of sense amplifier groups.

14. The memory device of claim 13, wherein:
each of the plurality of first local buses comprises a plurality of first local lines, and
each of the plurality of second local buses comprises a plurality of second local lines.

15. The memory device of claim 14, wherein each of the plurality of sense amplifier groups comprises a plurality of sense amplifiers, each suitable for receiving data of each of the plurality of first local lines through a first input terminal, receiving data of each of the plurality of second local lines through a second input terminal, amplifying the received data, and outputting the amplified data.

16. The memory device of claim 15, wherein each of the plurality of sense amplifiers comprises:
a first amplification unit suitable for amplifying and outputting the data of the first input terminal when a first strobe pulse is enabled and amplifying and outputting the data of the second input terminal when a second strobe pulse is enabled; and
a second amplification unit suitable for amplifying and outputting the data output by the first amplification unit when a third strobe pulse is enabled.

17. The memory device of claim 15, wherein each of the plurality of pipe latches comprises:
a first latch suitable for latching data first output by each of the plurality of sense amplifiers and outputting the latched data after a time corresponding to the specific interval; and
a second latch suitable for latching data second output by each of the plurality of sense amplifiers and outputting the latched data.

18. The memory device of claim 12, wherein:
if data of different two of the plurality of bank groups is continuously read, a CAD to CAS delay time (tCCD) is a first time, and
if data of one of the plurality of bank groups is continuously read, the tCCD is a second time longer than the first time.

19. The memory device of claim 18, wherein:
the first time comprises two clocks, and
the second time comprises four clocks.

* * * * *